US012520674B2

United States Patent
Jia et al.

(10) Patent No.: US 12,520,674 B2
(45) Date of Patent: Jan. 6, 2026

(54) DISPLAY PANEL WITH ISOLATION SLOT, AND DISPLAY DEVICE, AND METHOD OF MANUFACTURING THE SAME

(71) Applicants: Chengdu BOE Optoelectronics Technology Co., Ltd., Chengdu (CN); BOE TECHNOLOGY GROUP CO., LTD., Beijing (CN)

(72) Inventors: Li Jia, Beijing (CN); Tao Gao, Beijing (CN); Zubin Lv, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 907 days.

(21) Appl. No.: 17/630,275

(22) PCT Filed: Dec. 25, 2020

(86) PCT No.: PCT/CN2020/139675
§ 371 (c)(1),
(2) Date: Jan. 26, 2022

(87) PCT Pub. No.: WO2022/134092
PCT Pub. Date: Jun. 30, 2022

(65) Prior Publication Data
US 2022/0399524 A1    Dec. 15, 2022

(51) Int. Cl.
*H10K 59/124* (2023.01)
*H10K 59/12* (2023.01)
(Continued)

(52) U.S. Cl.
CPC ......... *H10K 59/124* (2023.02); *H10K 59/122* (2023.02); *H10K 71/00* (2023.02);
(Continued)

(58) Field of Classification Search
CPC ............... H10K 59/124; H10K 50/844; H10K 59/122
See application file for complete search history.

(56) References Cited

U.S. PATENT DOCUMENTS

| 2013/0087793 | A1 | 4/2013 | Kim et al. |
| 2017/0237025 | A1 | 8/2017 | Choi et al. |
| 2020/0119304 | A1* | 4/2020 | Choi ...................... H10K 59/12 |
| 2020/0343485 | A1 | 10/2020 | Kim et al. |
| 2021/0028249 | A1 | 1/2021 | Ding et al. |

FOREIGN PATENT DOCUMENTS

| CN | 1450659 A | 10/2003 |
| CN | 107424519 A | 12/2017 |

(Continued)

OTHER PUBLICATIONS

First Office Action of CN Patent Application No. 202111009749.9 of Jun. 19, 2024.
International Search Report and Written Opinion for International Application No. PCT/CN2020/139675 mailed Jul. 26, 2021.

*Primary Examiner* — Lex H Malsawma
*Assistant Examiner* — Bruce R. Smith
(74) *Attorney, Agent, or Firm* — Perilla Knox & Hildebrandt LLP; Kenneth A. Knox

(57) ABSTRACT

A display panel of the present disclosure includes a substrate. A driving layer is arranged on a side of the substrate, and has an opening, a pixel area outside the opening, and a transition area therebetween; a surface of the driving layer distal to the substrate is provided with an isolation slot, located in the transition area and surrounding the opening. The isolation slot includes a first and second slot body intercommunicated towards the substrate. An orthographic projection of one side wall of the second slot body is outside that of the first slot body, and an orthographic projection of another side wall of the second slot body is between that of (Continued)

the two side walls of the first slot body. The light-emitting device layer is arranged on the surface of the driving layer distal to the substrate and includes a light-emitting functional layer, disconnected in the second slot body.

20 Claims, 14 Drawing Sheets

(51) Int. Cl.
  *H10K 59/122* (2023.01)
  *H10K 59/131* (2023.01)
  *H10K 59/80* (2023.01)
  *H10K 71/00* (2023.01)
(52) U.S. Cl.
  CPC ....... *H10K 59/1201* (2023.02); *H10K 59/131* (2023.02); *H10K 59/873* (2023.02)

(56) References Cited

FOREIGN PATENT DOCUMENTS

| | | | | |
|---|---|---|---|---|
| CN | 107799533 A | 3/2018 | | |
| CN | 107799553 A | 3/2018 | | |
| CN | 108155299 A | 6/2018 | | |
| CN | 108493155 A | 9/2018 | | |
| CN | 109671870 A | 4/2019 | | |
| CN | 110265583 A | 9/2019 | | |
| CN | 110600526 A | 12/2019 | | |
| CN | 110634928 A | 12/2019 | | |
| CN | 110739342 A | 1/2020 | | |
| CN | 111244112 A | * 6/2020 | ......... | H01L 27/1218 |
| CN | 111415974 A | 7/2020 | | |
| CN | 111584602 A | 8/2020 | | |

* cited by examiner

DISPLAY PANEL WITH ISOLATION SLOT, AND DISPLAY DEVICE, AND METHOD OF MANUFACTURING THE SAME

CROSS-REFERENCE TO RELATED APPLICATION

The present application is a national phase application under 35 U.S.C. § 371 of International Application No. PCT/CN2020/139675 filed Dec. 25, 2020, the contents of which being incorporated by reference in their entirety herein.

TECHNICAL FIELD

The disclosure relates to the technical field of display and, in particular, to a display device, a display panel, and a method of manufacturing the display panel.

BACKGROUND

In a display device having a front photographing function, such as mobile phone, in order to narrow a frame and improve screen proportion, a camera device may be set below a screen instead of within the frame. However, in order to prevent the screen from blocking light and thus affecting photosensitivity of the camera device, a hole may be opened in the screen so that the camera device can take an image. However, abnormal patterns are easy to appear around the opening area, which affects display effect.

It should be noted that information disclosed in the above background technology part is only used to strengthen understanding of the background of the present disclosure, so it may include information that does not constitute the prior art known to those skilled in the art.

SUMMARY

An object of the present disclosure is to provide a display device, a display panel, and a method of manufacturing the display panel.

According to an aspect of the present disclosure, there is provided a display panel, including:
a substrate;
a driving layer, arranged on a side of the substrate, and having an opening, a pixel area outside the opening, and a transition area between the opening and the pixel area, wherein an isolation slot is provided on a surface of the driving layer distal to the substrate, the isolation slot is located in the transition area and at least partially surrounds the opening, the isolation slot includes a first slot body and a second slot body sequentially intercommunicated towards the substrate, an orthographic projection of the one side wall of the second slot body on the substrate is outside an orthographic projection of the first slot body on the substrate, and an orthographic projection of another side wall of the second slot body on the substrate is between orthographic projections of two side walls of the first slot body; and
a light-emitting device layer, arranged on the surface of the driving layer distal to the substrate, and including a light-emitting functional layer extending to the transition area, wherein the light-emitting functional layer is disconnected in the second slot body.

In an exemplary embodiment of the present disclosure, the driving layer includes:
a pixel circuit layer, arranged on a side of the substrate;
a first planarization layer, covering the pixel circuit layer;
a conductive layer, arranged on a surface of the first planarization layer distal to the substrate;
a second planarization layer, covering the conductive layer and the first planarization layer, wherein the second slot body is arranged in the second planarization layer; and
a separation layer, arranged on a surface of the second planarization layer distal to the substrate, and located in the transition area, wherein a material of the separation layer is different from that of the second planarization layer, and the first slot body is arranged in the separation layer.

In an exemplary embodiment of the present disclosure, the first slot body includes a first side wall and a second side wall opposite to each other, and the second slot body includes a third side wall and a fourth side wall opposite to each other,
the first side wall is located on a side of the second side wall distal to the opening, and the third side wall is located on a side of the fourth side wall distal to the opening, and
the first side wall is located on a side of the third side wall distal to the fourth side wall, and the second side wall is located between the third side wall and the fourth side wall.

In an exemplary embodiment of the present disclosure, a spacing between the first side wall and the third side wall is 0.5 μm to 1 μm.

In an exemplary embodiment of the present disclosure, the display panel further includes:
a first barrier dam, arranged in the transition area, and surrounding the opening, wherein the first barrier dam protrudes from the surface of the driving layer distal to the substrate, and the light-emitting functional layer covers the first barrier dam; and
a packaging layer, covering the light-emitting device layer and the first barrier dam, wherein the packaging layer includes an organic layer, and the organic layer is restricted on a side of the first barrier dam distal to the opening by the first barrier dam.

In an exemplary embodiment of the present disclosure, the light-emitting device layer further includes:
a first electrode layer, arranged on the surface of the driving layer distal to the substrate, and located in the pixel area, wherein the light-emitting functional layer is arranged on a surface of the first electrode layer distal to the substrate; and
a second electrode layer, covering the light-emitting function layer, and at least partially located in the pixel area, wherein the packaging layer further includes:
a first inorganic layer, covering the light-emitting device layer, the first barrier dam, and the isolation slot, wherein the organic layer is arranged on a surface of the first inorganic layer distal to the substrate; and
a second inorganic layer, covering the organic layer and the first inorganic layer.

In an exemplary embodiment of the present disclosure, the display panel further includes:
a second barrier dam, arranged in the transition area, and located on a side of the first barrier dam close to the opening, wherein a surface of the second barrier dam distal to the substrate is located on a side of a surface of the first barrier dam distal to the substrate, distal to the substrate,
wherein the light-emitting functional layer covers the second barrier dam.

In an exemplary embodiment of the present disclosure, a number of the isolation slot is multiple, and the first barrier dam and the second barrier dam are located between two adjacent said isolation slots.

In an exemplary embodiment of the present disclosure, the material of the separation layer is inorganic material, and the material of the second planarization layer an organic material.

In an exemplary embodiment of the present disclosure, the orthographic projection of the first slot body on the substrate and an orthographic projection of the second slot body on the substrate intersect, and an area of a region of the intersecting is less than an area of the orthographic projection of the first slot body on the substrate.

In an exemplary embodiment of the present disclosure, a center of the orthographic projection of the first slot body on the substrate and a center of an orthographic projection of the second slot body on the substrate do not overlap.

In an exemplary embodiment of the present disclosure, an overlapping area of orthographic projections of the separation layer and the second planarization layer on the substrate is less than an area of the orthographic projection of the second planarization layer on the substrate.

In an exemplary embodiment of the present disclosure, a depth of the first slot body is less than a depth of the second slot body.

In an exemplary embodiment of the present disclosure, the driving layer includes a plurality of film layers stacked in a direction distal to the substrate, the plurality of film layers include at least two adjacent film layers of different materials, and the first slot body and the second slot body are located in the two adjacent film layers of different materials.

According to an aspect of the present disclosure, a method of manufacturing a display panel is provided, including:
  forming a driving layer on a side of a substrate, wherein the driving layer has an opening, a pixel area outside the opening, and a transition area between the opening and the pixel area; and.
  forming an isolation slot on a surface of the driving layer distal to the substrate, wherein the isolation slot is located in the transition area and at least partially surrounds the opening, the isolation slot includes a first slot body and a second slot body sequentially intercommunicated towards the substrate, an orthographic projection of one side wall of the second slot body on the substrate is outside an orthographic projection of the first slot body on the substrate, and an orthographic projection of another side wall of the second slot body on the substrate is between orthographic projections of two side walls of the first slot body.

In an exemplary embodiment of the present disclosure, the driving layer includes:
  a pixel circuit layer, arranged on a side of the substrate;
  a first planarization layer, covering the pixel circuit layer;
  a conductive layer, arranged on a surface of the first planarization layer distal to the substrate; and
  a second planarization layer, covering the conductive layer and the first planarization layer,
  wherein forming the isolation slot on the surface of the driving layer distal to the substrate includes:
  forming a separation material layer on a surface of the second planarization layer distal to the substrate, wherein a material of the separation material layer is different from that of the second planarization layer;
  applying a photo-etching process on the separation material layer, to obtain a separation layer, wherein the separation layer is located in the transition area, and has a first slot body exposing the second planarization layer, and the first slot body includes a first side wall and a second side wall opposite to each other;
  forming a photoresist layer covering the separation layer and filling the first slot body;
  exposing and developing the photoresist layer, to form a removal area in the transition area surrounding the opening, wherein removal area exposes the second planarization layer, an orthographic projection of the removal area on the second planarization layer is located in the first slot body, a side wall of the removal area distal to the opening is located on a side of the first side wall close to the opening, and a side wall of the removal area close to the opening overlaps the orthographic projection of the second side wall on the second planarization layer;
  etching the second planarization layer in the removal area by a dry etching process, to obtain the second slot body, wherein the second slot body includes a third side wall and a fourth side wall opposite to each other, an orthographic projection of the first side wall on the substrate is located outside an orthographic projection of the second slot body on the substrate, and the orthographic projection of the second side wall on the substrate is located between orthographic projections of the third side wall and the fourth side wall on the substrate; and
  removing the photoresist layer.

In an exemplary embodiment of the present disclosure, a thickness of the photoresist layer is 3.0 μm.

In an exemplary embodiment of the present disclosure, the material of the separation layer is inorganic material, and the material of the second planarization layer is organic material.

According to an aspect of the present disclosure, there is provided a display device, including:
  the display panel according to any one of claims 1-14; and
  a camera device, arranged on a side of the substrate distal to the driving layer, an orthographic projection of the camera device on the driving layer at least partially overlaps the opening, and the camera device is configured to capture images through the opening.

It should be understood that the above general description and the following detailed description are only exemplary and explanatory, and do not limit the present disclosure.

BRIEF DESCRIPTION OF THE DRAWINGS

The drawings herein are incorporated into and form a part of the description, showing embodiments consistent with the present disclosure, and are used together with the description to explain principles of the present disclosure. Understandably, the drawings in the following description are only some embodiments of the present disclosure. For those skilled in the art, other drawings may be obtained according to these drawings without paying creative labor.

DETAILED DESCRIPTION

Figure 1:
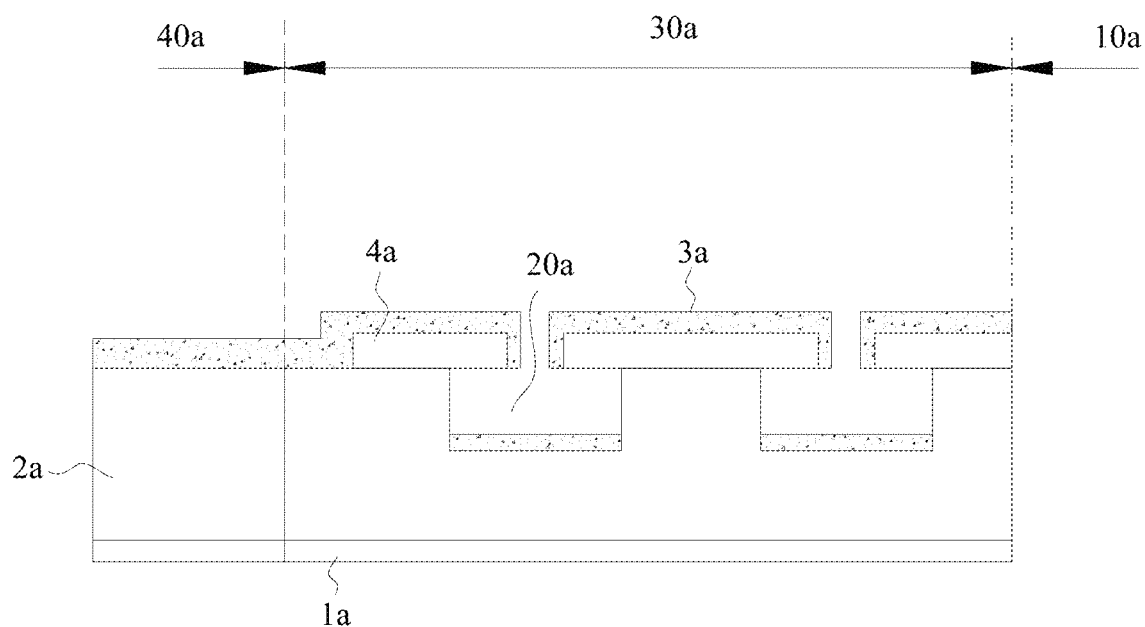
FIG. 1 is a partial schematic diagram of a display panel in the related art.

Example embodiments will now be described more fully with reference to accompanying drawings. However, the example embodiments may be implemented in a variety of forms and should not be construed as limited to the embodiments set forth herein; on the contrary, providing these embodiments makes the present disclosure comprehensive and complete, and fully conveys concept of the example embodiment to those skilled in the art. The same reference numerals in the drawings represent the same or similar structures, so their detailed description will be omitted. In addition, the accompanying drawings are only schematic diagrams of the present disclosure and are not necessarily drawn to scale.

Terms "a", "an", "the", "said", and "at least one" are used to indicate existence of one or more elements/components/etc.; terms "include" and "have" are used to mean open-ended inclusion and mean that there may be other elements/components/etc., in addition to the listed elements/components/etc.; and terms "first", "second", and "third", etc., are used only as marks, not as quantitative restrictions on their objects.

A description of reference numerals used in the figures are as follows: In FIG. 1: 1a, substrate; 2a, driving layer; 3a, light-emitting functional layer; 10a, opening; 20a, isolation slot; 30a, transition area; 40a, pixel area; and 4a, separation layer. In FIG. 2-FIG. 12: 1. substrate; 2, driving layer; 21, pixel circuit layer; 211, active layer; 212, first gate insulating layer; 213, gate layer; 214, second gate insulating layer; 215, interlayer dielectric layer; 216, source drain layer; 2161, source; 2162, drain; 217, passivation layer; 22, first planarization layer; 23, conductive layer; 24, second planarization layer; 25, separation layer; 20, isolation slot; 201, first slot body; 2011, first side wall; 2012, second side wall; 202, second slot body; 2021, third side wall; 2022, fourth side wall; 3, light-emitting device layer; 31, first electrode layer; 32, light-emitting functional layer; 33, second electrode layer; 34, pixel definition layer; 4, first barrier dam; 5, packaging layer; 51, first inorganic layer; 52, organic layer; 53, second inorganic layer; 6, second barrier dam; 001, opening; 002, pixel area; 003, transition area; 004, annular groove; 7, separation material layer; 8, photoresist layer; 81, removal area; 100, display panel; and 200, camera device.

In the related art, as shown in FIG. 1, a display panel includes a substrate 1a, a driving layer 2a, and a light-emitting device layer. The driving layer 2a is arranged on a side of the substrate 1a, and the light-emitting device layer is arranged on a side of the driving layer 2a distal to the substrate 1a for displaying an image. The driving layer 2a has pixel circuits, and the light-emitting device layer includes a plurality of light-emitting devices. The light-emitting device may be an OLED (organic light-emitting diode) light-emitting device, which may include a first electrode, a light-emitting functional layer 3a, and a second electrode sequentially stacked in a direction distal to the driving layer 2a. Meanwhile, electrical signals may be input to the first electrode and the second electrode through driving circuits on periphery of the driving layer 2a (for example, a light-emitting control circuit and a gate drive circuit, etc.) and a pixel driving circuit to drive the light-emitting functional layer 3a to emit light, thereby displaying the image.

The display panel may be provided with an opening 10a for transmitting light, and may be provided with a camera or other camera device on a side of the substrate 1a distal to the driving layer 2a to capture images through the opening 10a. However, the light-emitting functional layer 3a in the light-emitting device layer is usually organic material, and external water vapor and oxygen are able to easily enter into the inside of the display panel through the light-emitting functional layer 3a from the opening 10a, which corrodes the light-emitting device, thus shortening service life of the light-emitting device and affecting display effect. For the foregoing reasons, an isolation slot 20a surrounding the opening 10a may be formed in the display panel to disconnect the light-emitting functional layer 3a in the isolation slot 20a, so as to cut off invasion path of water vapor and oxygen.

For example, the driving layer 2a has a transition area 30a surrounding the opening 10a and a pixel area 40a surrounding the transition area 30a. The light-emitting devices are located within a range of the pixel area 40a, for displaying images. However, in order to simplify a manufacturing process, the light-emitting functional layer 3a may be formed as an entire layer, such that it can extend to the transition area 30a. An isolation slot 20a may be set on the driving layer 2a of the transition area 30a, and a separation layer 4a may be formed in the transition area 30a. The separation layer 4a covers the isolation slot 20a, and the separation layer 4a extends from both sides of the isolation slot 20a into the isolation slot 20a, but does not completely shield the isolation slot 20a. A part of the separation layer 4a extending into the isolation slot 20a may form a "cantilever" structure. When the light-emitting functional layer 3a is formed by evaporation process, due to shielding of the separation layer 4a, the light-emitting functional layer 3a cannot be formed on a surface of an area of the separation layer 4a extending into the isolation slot 20a and close to the substrate 1a, and on at least a part of a side wall of the isolation slot 20a, so that the light-emitting functional layer 3a may be disconnected in the isolation slot 20a. Particularly, the light-emitting functional layer 3a cannot be formed on a surface of a part of the separation layer 4a extending into the isolation slot 20a and close to the substrate 1a.

It was found that, if the above structure of shielding the isolation slot 20a from both sides by the separation layer 4a is adopted, and if it needs to coat photoresist or form other film layers in an entire layer during subsequent composition processes, due to the shielding of the separation layer 4a from both sides, a channel available for discharging air is reduced, such that the air in the isolation slot 20a is hard to be completely discharged, but to be blocked in the isolation slot 20a by the photoresist or other film layers, that is, "air entrapment" occurs; then, when vacuum pumping or air pressure changing, the photoresist or other film layers are easy to break, thus affecting proceeding of normal process, or forming abnormal patterns around the opening 10a, then affecting display effect.

It should be noted that FIG. 1 only illustrates a principle that the separation layer 4a and the isolation slot 20a disconnect the light-emitting functional layer 3a in the related technology, so some structures are omitted or simplified, which does not constitute a limitation on actual structure of the display panel.

The embodiment of the present disclosure provides a display panel, which may be an OLED display panel. As shown in FIGS. 2 to 5 and 13, the display panel may include a substrate 1, a driving layer 2, and a light-emitting device layer 3.

The driving layer 2 is arranged on a side of the substrate 1 and has an opening 001, a pixel area 002 outside the opening 001, and a transition area 003 between the opening 001 and the pixel area 002. A surface of the driving layer 2 distal to the substrate 1 is provided with an isolation slot 20 recessing towards the substrate 1, and the isolation slot 20 is located in the transition area 003 and at least partially surrounds the opening 001.

The isolation slot 20 includes a first slot body 201 and a second slot body 202 sequentially intercommunicated towards the substrate 1 along a direction of the recessing. An orthographic projection of one side wall of the second slot body 202 on the substrate 1 is outside an orthographic projection of the first slot body 201 on the substrate 1, and an orthographic projection of the other side wall of the second slot body 202 on the substrate 1 is between orthographic projections of the two side walls of the second slot body 202.

The light-emitting device layer 3 is arranged on the surface of the driving layer 2 distal to the substrate 1, and includes the light-emitting functional layer 32 extending to the transition area 003, and the light-emitting functional layer 32 is disconnected in the second slot body 202.

In the display panel of the embodiment of the present disclosure, the first slot body 201 and the second slot body 202 are intercommunicated and staggered, which can facilitate discharge air to avoid "air entrapment" under a condition of ensuring that an erosion path of water vapor and oxygen is cut off. Specifically, since the orthographic projection of one side wall of the second slot body 202 on the substrate 1 is located outside orthographic projections of both sides of the first slot body 201 on the substrate 1, and the orthographic projection of the other side wall of the second slot body 202 on the substrate 1 is located between the orthographic projections of both sides of the first slot body 201 on the substrate 1, thus in a direction perpendicular to the substrate 1, one of the two side walls of the second slot body 202 is shielded, the other one is exposed by the first slot body 201, such that the light-emitting functional layer 32 cannot be formed at least on the side wall shielded by the first slot body 201 (e.g., the separation layer 25 below), and on the surface of the area of the first slot body 201 extending between the two side walls of the second slot body 202 close to the substrate 1, but be disconnected in the second slot body 202, to cut off the erosion path of water vapor and oxygen. Meanwhile, the other side wall of the second slot body 202 is not shielded, which is convenient to expand the channel for discharging air, so as to discharge the air smoothly, then preventing a phenomenon of "air entrapment", so as to avoid rupture of photoresist or other film layers in the subsequent processes, and finally avoid abnormal patterns, thus being conducive to improving the display effect.

The display panel according to the embodiment of the present disclosure will be described in detail below.

The substrate 1 is a flat plate structure, which can adopt hard materials such as glass, or flexible materials such as PI (polyimide). The substrate 1 may be a single-layer or multi-layer structure, which is not specially limited here.

As shown in FIGS. 2 to 5, the driving layer 2 is arranged on a side of the substrate 1, to drive the light-emitting device layer 3 to emit light. Meanwhile, the driving layer 2 has an opening 001, a pixel area 002 and a transition area 003.

The opening 001 is used to transmit light when a camera device takes images. The opening 001 can penetrate the driving layer 2, to expose the substrate 1, or can further penetrate the substrate 1. The shape of the opening 001 may be circular, semicircular, waist circular, etc., and its shape is not specially limited here.

The pixel area 002 is used to emit light, to display images. The pixel area 002 can surround outside the opening 001, that is, periphery of the opening 001 can display the images. Alternatively, a boundary of the opening 001 may partially overlap with a boundary of the driving layer 2, and accordingly, the pixel area 002 does not completely surround outside the opening 001. Here, it will only take the pixel area 002 surrounding outside the opening 001 as an example.

The transition area 003 is between the opening 001 and the pixel area 002. For example, the pixel area 002 surrounds the opening 001, and the transition area 003 is an annular area surrounding a circle of the opening 001.

Figure 3:
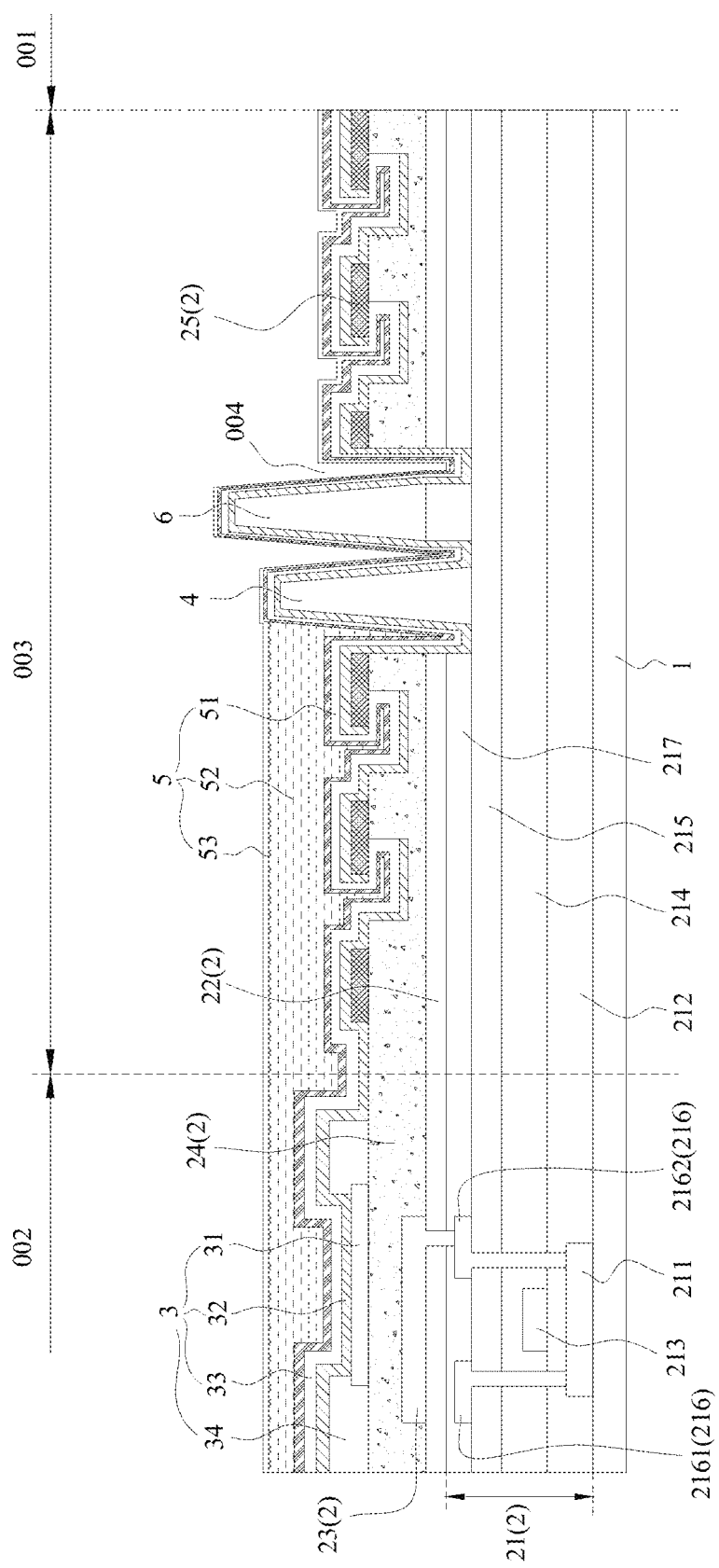
FIG. 3 is a section A-A of the display panel in FIG. 1.

In some embodiments of the present disclosure, as shown in FIG. 3, the driving layer 2 may include a pixel circuit layer 21, a first planarization layer 22, a conductive layer 23, and a second planarization layer 24.

The pixel circuit layer 21 may be arranged on a side of the substrate 1, and at least partially located in the pixel area 002. The pixel circuit layer 21 may be used to drive the light-emitting device layer 3 to emit light. Specifically, the pixel circuit layer 21 may include a plurality of pixel circuits, and the light-emitting device layer 3 may include a plurality of light-emitting devices, and the respective pixel circuits drive the respective light-emitting devices to emit light in one-to-one correspondence.

The pixel circuit for driving the light-emitting device layer 3 to emit light, may be 7T1C, 7T2C, 6T1C, 6T2C, or other types of pixel circuits, as long as it can drive the light-emitting device layer 3 to emit light, its structure is not specially limited here, wherein nTmC represents that one pixel circuit includes n transistors (represented by letter "T"), and m capacitors (represented by letter "C").

The pixel circuit includes at least a driving transistor. Taking a structure including the driving transistor as an example, as shown in FIG. 3, the pixel circuit layer 21 may include an active layer 211, a first gate insulating layer 212, a gate layer 213, a second gate insulating layer 214, an interlayer dielectric layer 215, a source drain layer 216, and a passivation layer 217 sequentially stacked on the substrate 1, wherein, the source drain layer 216 includes a source 2161 and a drain 2162 connected to the active layer 211. The passivation layer 217 may cover the source drain layer 216 and the interlayer dielectric layer 215.

The first planarization layer 22 covers the pixel circuit layer 21, that is, covers the source drain layer 216, and the passivation layer 217 not covered by the source drain layer 216.

The conductive layer 23 is arranged on a surface of the first planarization layer 22 distal to the substrate 1, and connected with the source drain layer 216, and its material may be the same as that of the source drain layer 216. A pattern of the conductive layer 23 is not specially limited here.

The second planarization layer 24 covers the conductive layer 23 and the first planarization layer 22. Both the second planarization layer 24 and the first planarization layer 22 may use transparent organic material, and their materials may be the same.

The active layer 211, the gate layer 213, and the source drain layer 216 described above may be located in the pixel area 002, while the first gate insulating layer 212, the second gate insulating layer 214, the interlayer dielectric layer 215, the passivation layer 217, the first planarization layer 22, and the second planarization layer 24 may be located in the pixel area 002 and the transition area 003, and may be structures of entire layers. That is, in the transition area 003, the first gate insulating layer 212, the second gate insulating layer 214, the interlayer dielectric layer 215, the passivation layer 217, the first planarization layer 22, and the second planarization layer 24 are sequentially stacked on the substrate 1 in a direction distal to the substrate 1.

Figure 13:
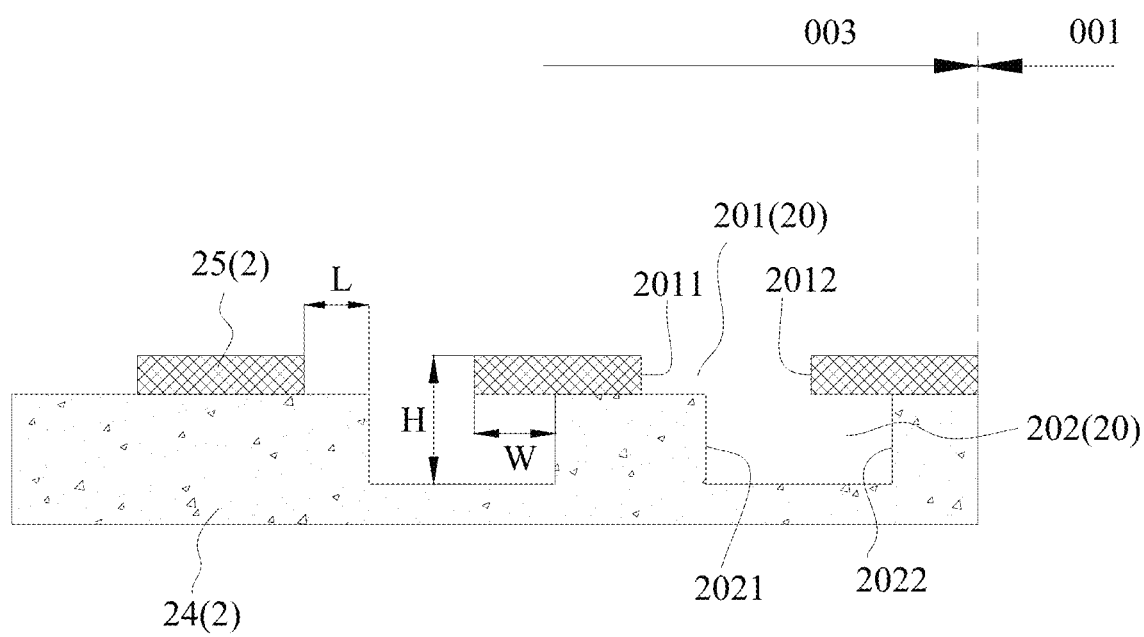
FIG. 13 is a partial structural diagram of step S1260 in an embodiment of the manufacturing method of the present disclosure.

As shown in FIGS. 3 and 13, based on the above driving layer 2, in order to disconnect the light-emitting functional layer 32, the isolation slot 20 recessing towards the substrate 1 may be provided on the surface of the driving layer 2 distal to the substrate 1. The isolation slot 20 is located in the transition area 003, and at least partially surrounds the opening 001. For example, the isolation slot 20 may be an annular groove around a circle of the opening 001. Meanwhile, the isolation slot 20 includes the first slot body 201 and the second slot body 202 sequentially intercommunicated towards the substrate 1 along the direction of the recessing, and the first slot body 201 and the second slot body 202 are staggered. That is, one side wall of the first slot body 201 is located outside the second slot body 202, and the other side wall of the first slot body 201 is located between the two side walls of the second slot body 202. That is, the orthographic projection of the one side wall of the second slot body 202 on the substrate 1 is outside the orthographic projection of the first slot body 201 on the substrate 1, and the orthographic projection of the other side wall of the second slot body 202 on the substrate 1 is between the orthographic projections of the two side walls of the first slot body 201 on the substrate 1. That is, the one side wall of the second slot body 202 is exposed by the first slot body 201 for discharging air, and the other side wall of the second slot body 202 is not exposed, such that formation of the light-emitting functional layer 32 may be avoided, thereby cutting off the invasion path of water vapor and oxygen.

Further, the orthographic projections of the first slot body 201 and the second slot body 202 on the substrate 1 intersect, and an area of a region of the intersecting is less than an area of the orthographic projection of the first slot body 201 on the substrate 1. That is, the first slot body 201 and the second slot body 202 do not completely overlap in the direction perpendicular to the substrate 1.

Centers of the orthographic projections of the first slot body 201 and the second slot body 202 do not overlap, so that the first slot body 201 and the second slot body 202 are staggered.

In order to form the above isolation slot 20, the driving layer 2 may include a plurality of film layers stacked in a direction distal to the substrate 1. Materials of at least two adjacent film layers in the plurality of film layers are different, and the first slot body 201 and the second slot body 202 are respectively located in two adjacent film layers of different materials, so as to form the above staggered first slot body 201 and second slot body 202.

For example, in some embodiments of the present disclosure, as shown in FIGS. 3 and 13, the driving layer 2 includes the above pixel circuit layer 21, the first planarization layer 22, the conductive layer 23, and the second planarization layer 24. The second slot body 202 may be set in an area of the second planarization layer 24 located in the transition area 003, and a separation layer 25 may be set on a surface of the second planarization layer 24 distal to the substrate 1, and an overlapping area of orthographic projections of the separation layer 25 and the second planarization layer 24 on the substrate 1 is less than an area of the orthographic projection of the second planarization layer 24 on the substrate 1, that is, the separation layer 25 covers only a part of area of the second planarization layer 24. The first slot body 201 staggered and intercommunicated with the second slot body 202 is arranged in the separation layer 25, to obtain the isolation slot 20.

Specifically, the separation layer 25 is arranged on the surface of the second planarization layer 24 distal to the substrate 1 and in the transition area 003. The first slot body 201 is an annular groove arranged in the separation layer 25, which penetrates the separation layer 25 in the direction perpendicular to the substrate 1 and surrounds the opening 001. The first slot body 201 includes a first side wall 2011 and a second side wall 2012 opposite to each other.

The second slot body 202 is arranged in the second planarization layer 24, and recessing towards the substrate 1. A depth of the second slot body 202 may be less than a thickness of the second planarization layer 24, that is, it does not penetrate the second planarization layer 24, or it may be equal to or greater than the depth of the second planarization layer 24 as well, so as to penetrate the second planarization layer 24 or even recessing into the first planarization layer 22. Here, the depth of the second slot body 202 is not specially limited. The second slot body 202 includes a third side wall 2021 and a fourth side wall 2022 opposite to each other.

The first side wall 2011 is located outside the second slot body 202, and the second side wall 2012 is located between the third side wall 2021 and the fourth side wall 2022, such that the first slot body 201 and the second slot body 202 are staggered, so that only one side wall of the second slot body 202 is exposed by the first slot body 201, while the other side wall is not exposed by the first slot body 201.

For example, as shown in FIGS. 3 and 13, the first sidewall 2011 may be located on a side of the second sidewall 2012 distal to the opening 001, the third sidewall 2021 is located on a side of the fourth sidewall 2022 distal to the opening 001, and the first sidewall 2011 is located on a side of the third sidewall 2021 distal to the fourth sidewall 2022.

An area of the second planarization layer 24 located between the first side wall 2011 and the third side wall 2021 is annular, and exposed by the first slot body 201. A width of the area, that is, a spacing L between the first side wall 2011 and the third side wall 2021, may be 0.5 µm-1 µm. For example, L may be 0.5 µm, 0.7 µm, or 1 µm, etc., or, may be less than 0.5 µm, or greater than 1 µm as well. In addition, a depth H of the isolation slot 20 in the direction perpendicular to the substrate 1 may be 0.3 μm-0.5 μm. The depth H is a sum of depths of the first slot body 201 and the second slot body 202, that is, a distance between a surface of the separation layer 25 distal to the substrate 1 and a bottom surface of the second slot body 202, or for a circumstance of penetrating the second planarization layer 24, a distance between a surface of the separation layer 25 distal to the substrate 1 and a surface of the first planarization layer 22 distal to the substrate 1. A width W of an area of the separation layer 25 located in the second slot body 202 (e.g., a distance between the second side wall 2012 and the fourth side wall 2022 in FIG. 13), may be 1.5 μm-2 μm. In addition, the depth of the first slot body 201 may be less than that of the second slot body 202.

Positions of the first side wall 2011, the second side wall 2012, the third side wall 2021, and the fourth side wall 2022 with respect to the opening 001 may be changed, as long as it may be ensured that only one side wall of the second slot body 202 is exposed by the first slot body 201.

In order to facilitate formation of the isolation slot 20, material of the separation layer 25 may be one or more inorganic materials such as silicon nitride, and the material of the separation layer 25 may be the same as that of the passivation layer 217. Material of the second planarization layer 24 may be one or more organic materials, thus, the first slot body 201 and the second slot body 202 may be formed by an etching selection ratio of dry etching to different materials, the detailed process of which may be referred to the embodiment of the method of manufacturing of the display panel below, which will not be described in detail here. The second planarization layer 24 and the separation layer 25 are the two adjacent film layers of different materials.

As shown in FIG. 3, the light-emitting device layer 3 may be arranged on the surface of the driving layer 2 distal to the substrate 1, and may include a plurality of light-emitting devices located in the pixel area 002, and each of the light-emitting devices may be connected with a driving transistor of a corresponding pixel circuit to receive a driving signal.

The light-emitting device may be an OLED light-emitting device, and may include a light-emitting functional layer, and a cathode and anode on both sides of the light-emitting functional layer. By applying the driving signal to the cathode and anode, the organic light-emitting layer may emit light. A principle of light-emitting of OLED light-emitting device is not specially limited here. The driving signal may be applied to the anode through the pixel circuit.

For example, in some embodiments of the present disclosure, as shown in FIG. 3, the light-emitting device layer 3 may include a first electrode layer 31, a light-emitting function layer 32, and a second electrode layer 33.

The first electrode layer 31 is arranged on the surface of the driving layer 2 distal to the substrate 1, and located in the pixel area 002. The first electrode layer 31 may include a plurality of first electrodes. Each of the first electrodes may be used as an anode of a light-emitting device, and connected with the conductive layer 23, and then connected with the source drain layer 216 through the conductive layer 23.

The light-emitting functional layer 32 may be arranged on a surface of the first electrode layer 31 distal to the substrate 1, and is a continuous film layer extending to the transition area 003, so as to be formed as an entire layer, to avoid using a fine mask. The light-emitting functional layer 32 covers an area at which the isolation slot 20 is located, and extends into the isolation slot 20 at the isolation slot 20. However, the light-emitting functional layer 32 is disconnected at least on the side wall (such as the fourth side wall 2022) of the second slot body 202 not exposed by the first slot body 201, and on the surface of the area of the separation layer 25 located in the second slot body 202 and close to the substrate 1, so as to cut off the intrusion path of water vapor and oxygen. Particularly, the light-emitting functional layer 32 cannot be formed on the surface of the area of the separation layer 25 extending to the second slot body 202 and close to the substrate 1.

The light-emitting functional layer 32 is a multilayer structure of organic light-emitting material. For example, the light-emitting functional layer 32 may include at least a hole injection layer, a hole transport layer, an organic light-emitting layer, an electron transport layer, and an electron injection layer sequentially stacked on the first electrode layer 31. In the respective film layers of the light-emitting functional layer 32, only a part of the film layers may extend to the transition area 003, or all of the film layers may extend to the transition area 003.

The second electrode layer 33 covers the light-emitting function layer 32, which may be used as a cathode of the light-emitting device, and is at least partially located in the pixel area 002. For example, the second electrode layer 33 is made of metal, and is located in the pixel area 002 and the transition area 003, however, since its manufacturing process is different from that of the light-emitting functional layer 32, the second electrode layer 33 is not limited that it is disconnected in the isolation slot 20.

In some embodiments of the present disclosure. The second electrode layer 33 may be a multilayer structure, for example, it may include a first metal layer, a second metal layer, and a third metal layer stacked sequentially in the direction distal to the substrate 1, wherein material of the first metal layer and the third metal layer may be aluminum, and material of the second metal layer may be silver. The second electrode layer 33 may adopt other multi-layer structures or single-layer structures as well, and both the material and structure are not specially limited.

The respective light-emitting devices may share the same light-emitting functional layer 32, or a film layer arranged as an entire layer in the light-emitting functional layer 32. Meanwhile, the respective light-emitting devices may share the same second electrode layer 33.

In addition, in order to define ranges of the respective light-emitting devices in the light-emitting functional layer 32, the light-emitting device layer 3 may include a pixel definition layer 34 as well, which may be arranged on the surface of the second planarization layer 24 distal to the substrate 1. The pixel definition layer 34 is provided with a plurality of openings, each of the openings exposes a first electrode 31, and the light-emitting functional layer 32 and the second electrode layer 33 within a range of the opening and the first electrode exposed by the opening may be used as a light-emitting device.

Figure 4:
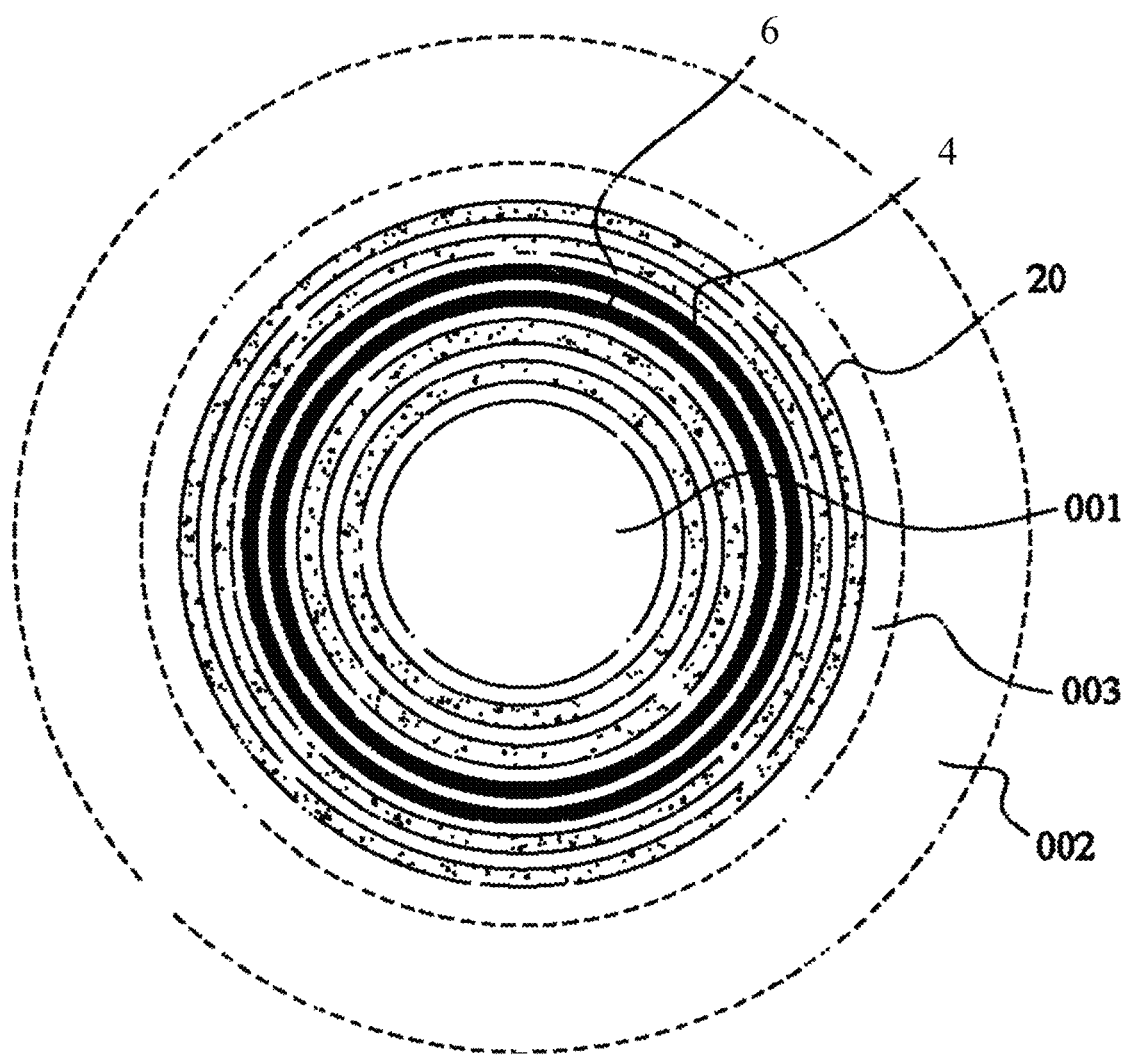
FIG. 4 is a schematic diagram of arrangement of isolation slots in an embodiment of the display panel of the present disclosure.
Figure 5:
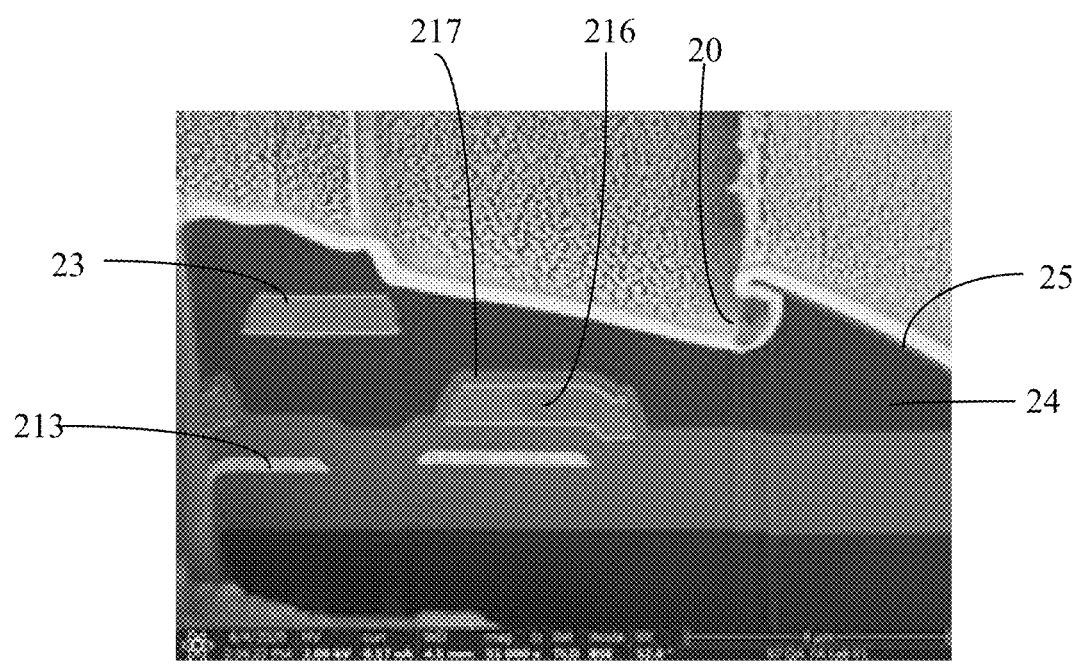
FIG. 5 is a partial electron microscopic view of an embodiment of the display panel of the present disclosure.

As shown in FIGS. 3 and 4, the display panel of the present disclosure may further include a first barrier dam 4 and a packaging layer 5.

The first barrier dam 4 is arranged in the transition area 003, and surrounds the opening 001, and the first barrier dam 4 protrudes from the surface of the driving layer 2 distal to the substrate 1. For example, the transition area 003 may be provided with an annular groove 004 exposing the passivation layer 217, and the first barrier dam 4 is an annular convex surrounding the opening 001, which may be arranged on a surface of the passivation layer 217 distal to the substrate 1, and located in the annular groove 004. The first barrier dam 4 may use the same material as that of the first planarization layer 22 or the second planarization layer 24, to be formed at one time through processes such as gray scale mask. Alternatively, the first barrier dam 4 may be a multi-layer structure as well, and its specific structure is not specially limited here. The first barrier dam 4 may be arranged on the surface of the first planarization layer 22 or the second planarization layer 24 distal to the substrate 1 as well.

As shown in FIGS. 3 and 4, the packaging layer 5 covers the light-emitting device layer 3 and the first barrier dam 4, and the packaging layer 5 includes a first inorganic layer 51, an organic layer 52, and a second inorganic layer 53.

The first inorganic layer 51 covers the light-emitting device layer 3, the first barrier dam 4, and the isolation slot 20, and the first inorganic layer 51 matches the convex at the first barrier dam 4, matches the recessing at the isolation slot 20, and can continuously extend in the isolation slot 20 without disconnection.

The organic layer 52 is arranged on a surface of the first inorganic layer 51 distal to the substrate 1, and is restricted on a side of the first barrier dam 4 distal to the opening 001.

The second inorganic layer 53 covers the organic layer 52 and the first inorganic layer 51.

Further, as shown in FIGS. 3 and 4, the display panel may further include a second barrier dam 6, which may be located in the transition area 003, and on a side of the first barrier dam 4 close to the opening 001, and a surface of the second barrier dam 6 distal to the substrate 1 is located on a side of a surface of the first barrier dam 4 distal to the substrate 1, that is, a top of the second barrier dam 6 is higher than a top of the first barrier dam 4. The second barrier dam 6 may prevent extending of the organic layer 52 to the opening 001. In addition, the light-emitting functional layer 32 covers the second barrier dam 6, and the second electrode layer 33 extends to an area of the second barrier dam 6 corresponding to the light-emitting functional layer 32 as well.

Further, as shown in FIGS. 3 and 4, in some embodiments of the present disclosure, a number of the isolation slot 20 may be multiple, and the first barrier dam 4 and the second barrier dam 6 are located between two adjacent isolation slots 20. For example, the number of isolation slots 20 is four, and arranged concentrically to surround the opening 001. The first barrier dam 4 and the second barrier dam 6 are located between the two isolation slots 20 in the middle. The organic layer 52 may be filled in the isolation slots 20 on the side of the first barrier dam 4 distal to the opening 001.

Figure 6:
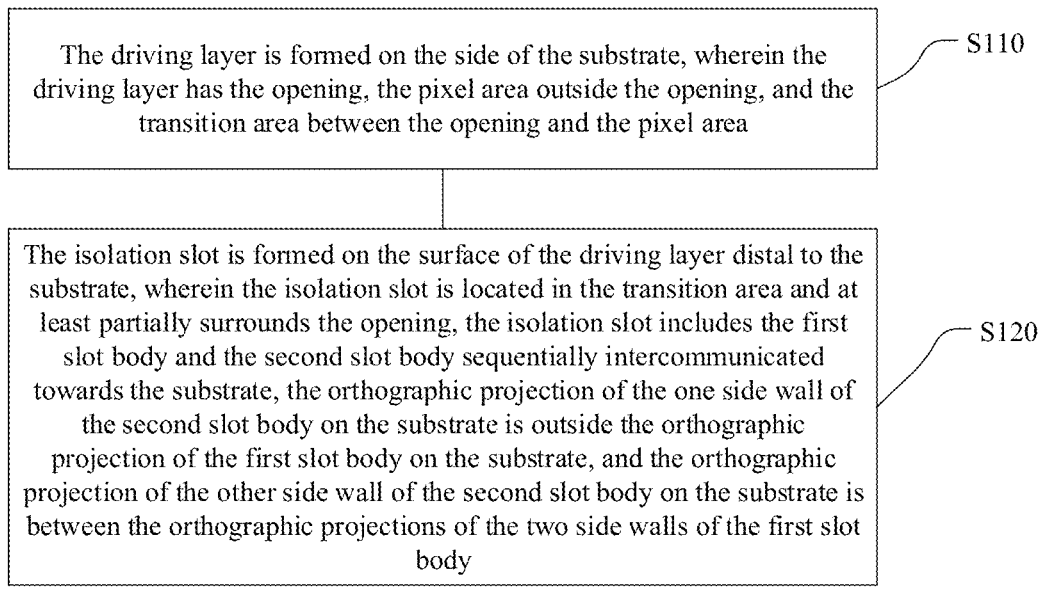
FIG. 6 is a flowchart of an embodiment of a manufacturing method of the present disclosure.

The embodiment of the present disclosure further provides a method of manufacturing a display panel. The display panel may be a display panel of any of the above embodiments, and its structure will not be described in detail here. As shown in FIG. 6, the method of manufacturing the display panel may include steps S110 to S120.

In step S110, the driving layer is formed on the side of the substrate, wherein the driving layer has the opening, the pixel area outside the opening, and the transition area between the opening and the pixel area.

In step S120, the isolation slot is formed on the surface of the driving layer distal to the substrate, wherein the isolation slot is located in the transition area and at least partially surrounds the opening, the isolation slot includes the first slot body and the second slot body sequentially intercommunicated towards the substrate, the orthographic projection of the one side wall of the second slot body on the substrate is outside the orthographic projection of the first slot body on the substrate, and the orthographic projection of the other side wall of the second slot body on the substrate is between the orthographic projections of the two side walls of the first slot body.

Figure 2:
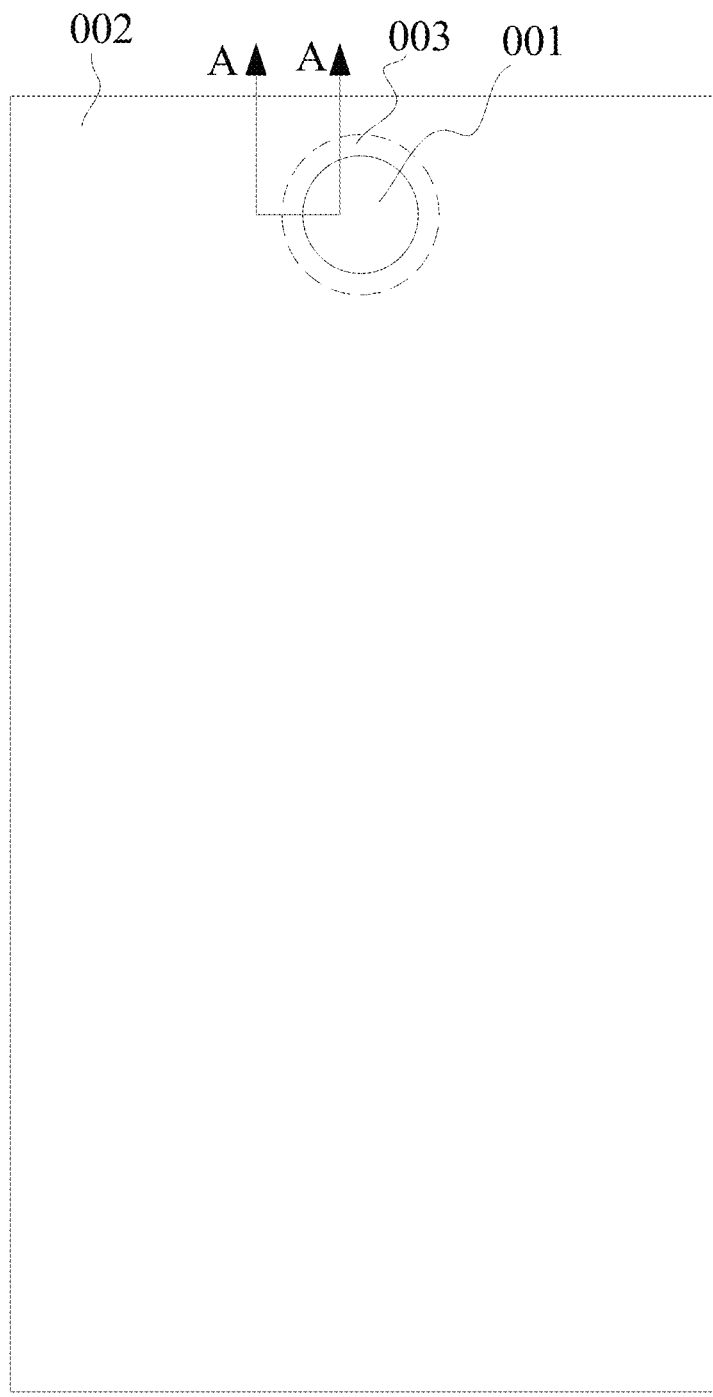
FIG. 2 is a top view of an embodiment of the display panel of the present disclosure.
Figure 7:
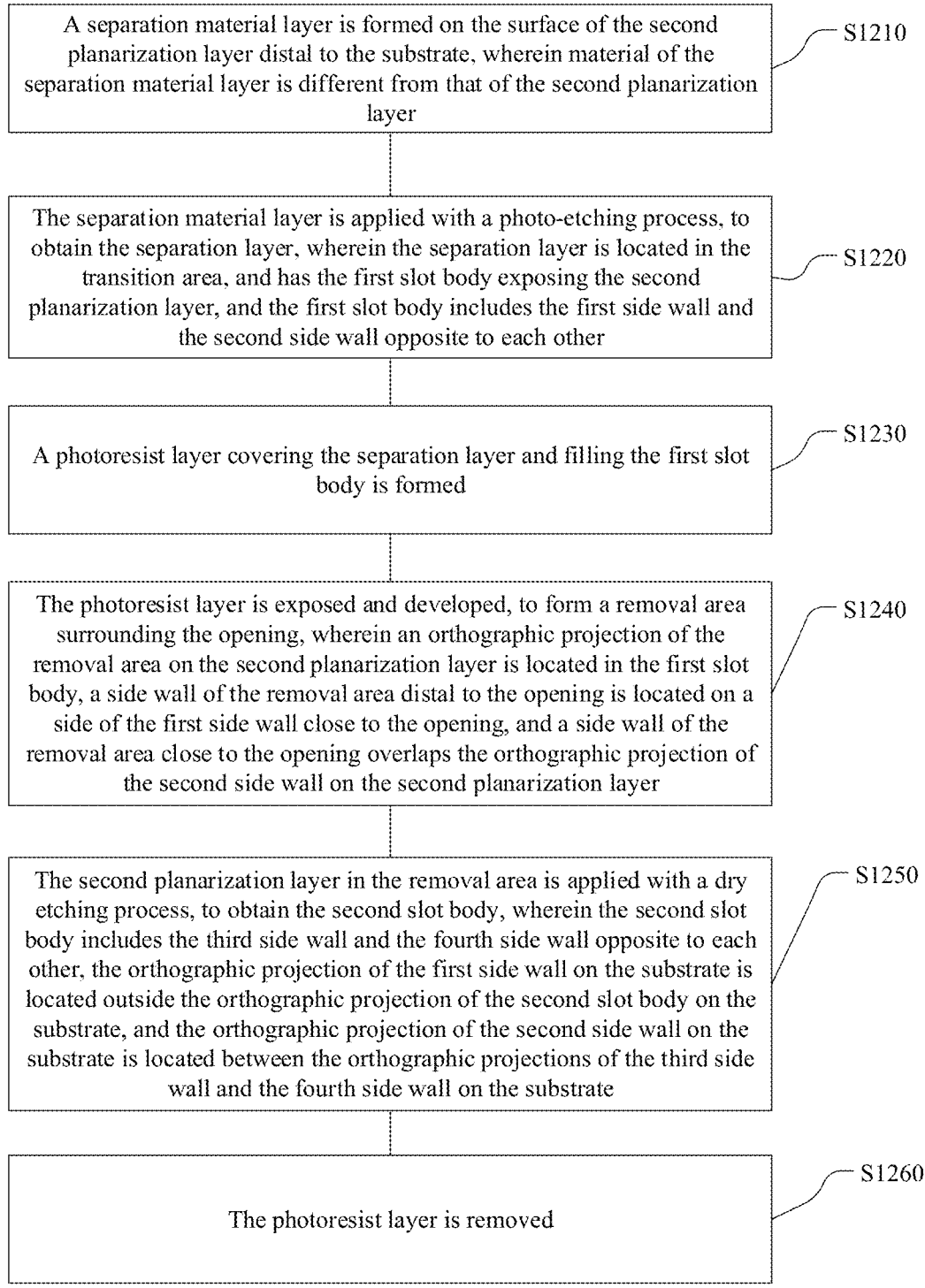
FIG. 7 is a flowchart of step S120 in an embodiment of the manufacturing method of the present disclosure.

In some embodiments of the present disclosure, as shown in FIGS. 2 and 3, the driving layer 2 includes the pixel circuit layer 21, the first planarization layer 22, the conductive layer 23, and the second planarization layer 24. The detailed structure can be referred to the embodiment of the display panel, which will not be described in detail here. Accordingly, as shown in FIG. 7, the isolation slot recessing towards the substrate is formed on the surface of the driving layer distal to the substrate, that is, step S120 may include steps S1210 to S1260.

In step S1210, a separation material layer is formed on the surface of the second planarization layer distal to the substrate, wherein the material of the separation material layer is different from that of the second planarization layer.

Figure 8:
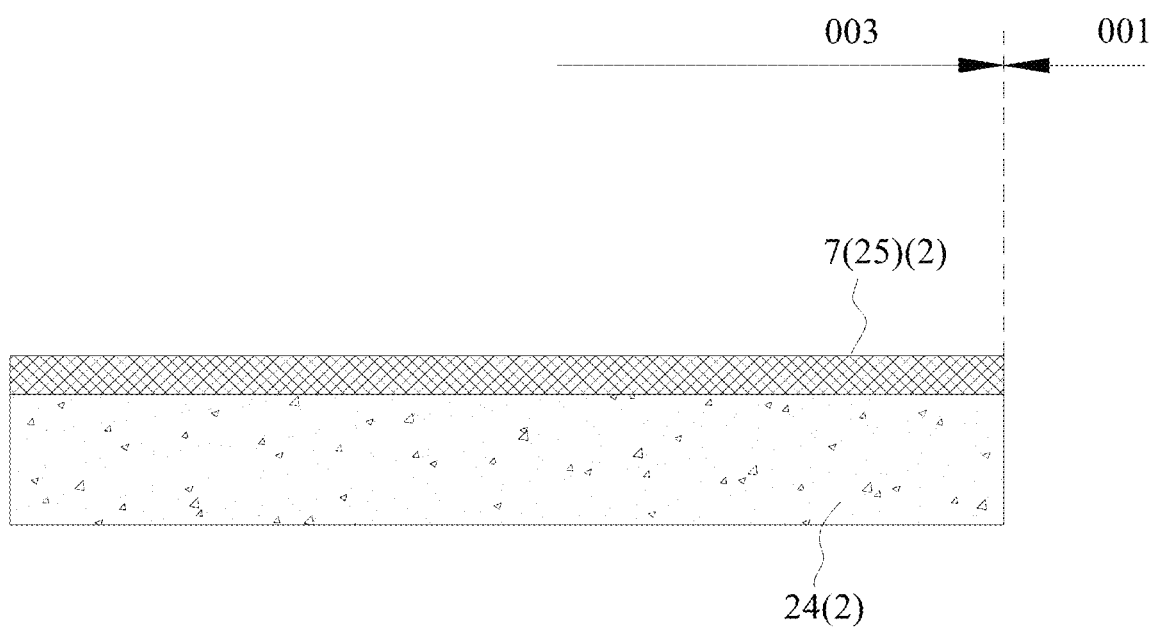
FIG. 8 is a partial structural diagram of step S1210 in an embodiment of the manufacturing method of the present disclosure.

As shown in FIG. 8, the separation material layer 7 may completely cover the surface of the second planarization layer 24 distal to the substrate 1.

In step S1220, the separation material layer is applied with a photo-etching process, to obtain the separation layer, wherein the separation layer is located in the transition area, and has the first slot body exposing the second planarization layer, and the first slot body includes the first side wall and the second side wall opposite to each other.

Figure 9:
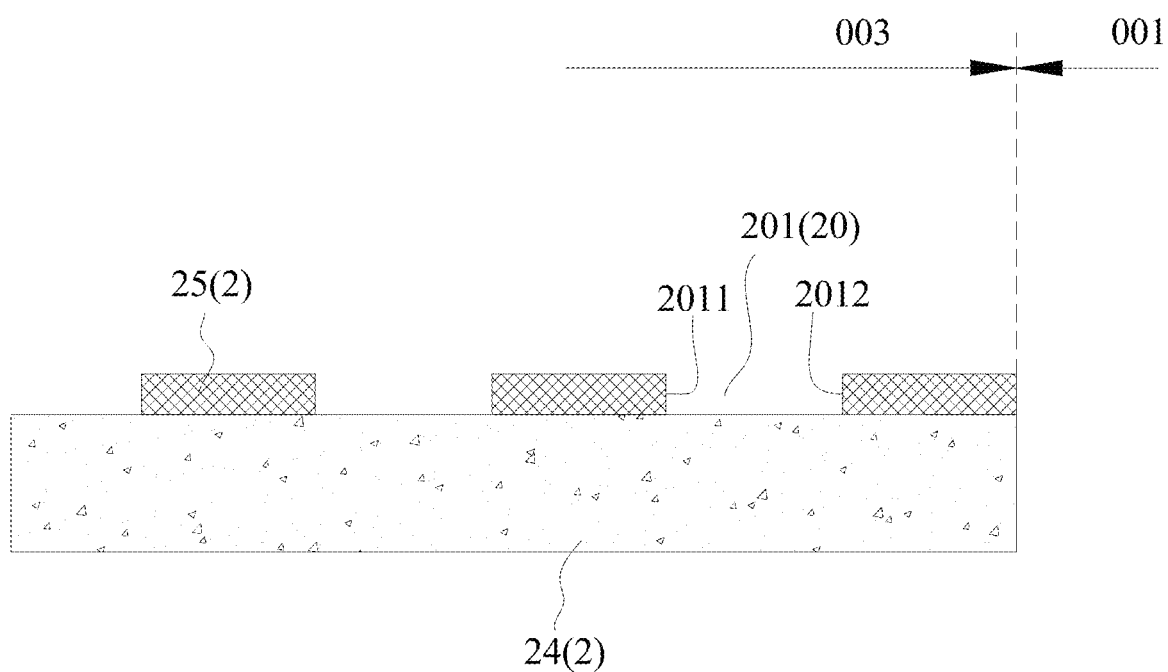
FIG. 9 is a partial structural diagram of step S1220 in an embodiment of the manufacturing method of the present disclosure.

As shown in FIG. 9, the photo-etching process may include processes such as coating photoresist, exposure, development, and etching, which can pattern the separation material layer 7, to remove the separation material layer 7 outside the transition area 003, and form the first slot body 201 exposing the second planarization layer 24 in the separation material layer 7 in the transition area 003, so as to obtain the separation layer 25. The specific structure of the separation layer 25 has been described in detail in the above embodiment of the display panel, and will not be described in detail here.

In step S1230, a photoresist layer covering the separation layer and filling the first slot body is formed.

Figure 10:
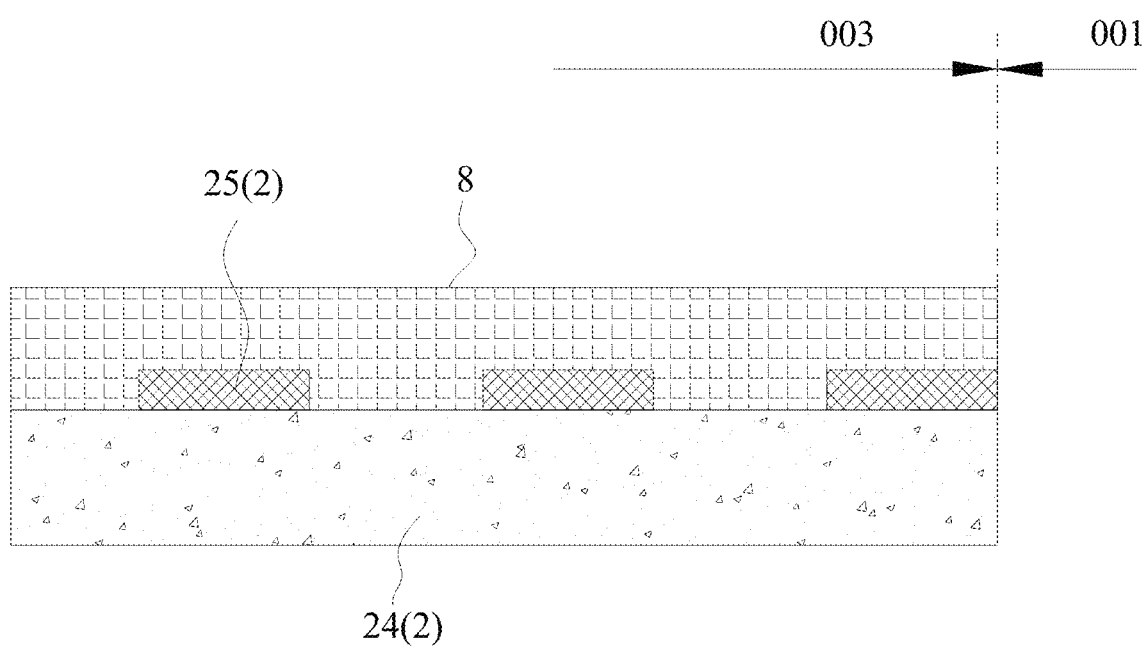
FIG. 10 is a partial structural diagram of step S1230 in an embodiment of the manufacturing method of the present disclosure.

As shown in FIG. 10, the photoresist layer 8 may cover the separation layer 25, and an area of the second planarization layer 24 that are not covered by the separation layer 25.

In step S1240, the photoresist layer is exposed and developed, to form a removal area surrounding the opening, wherein an orthographic projection of the removal area on the second planarization layer is located in the first slot body, a side wall of the removal area distal to the opening is located on a side of the first side wall close to the opening, and a side wall of the removal area close to the opening overlaps the orthographic projection of the second side wall on the second planarization layer.

Figure 11:
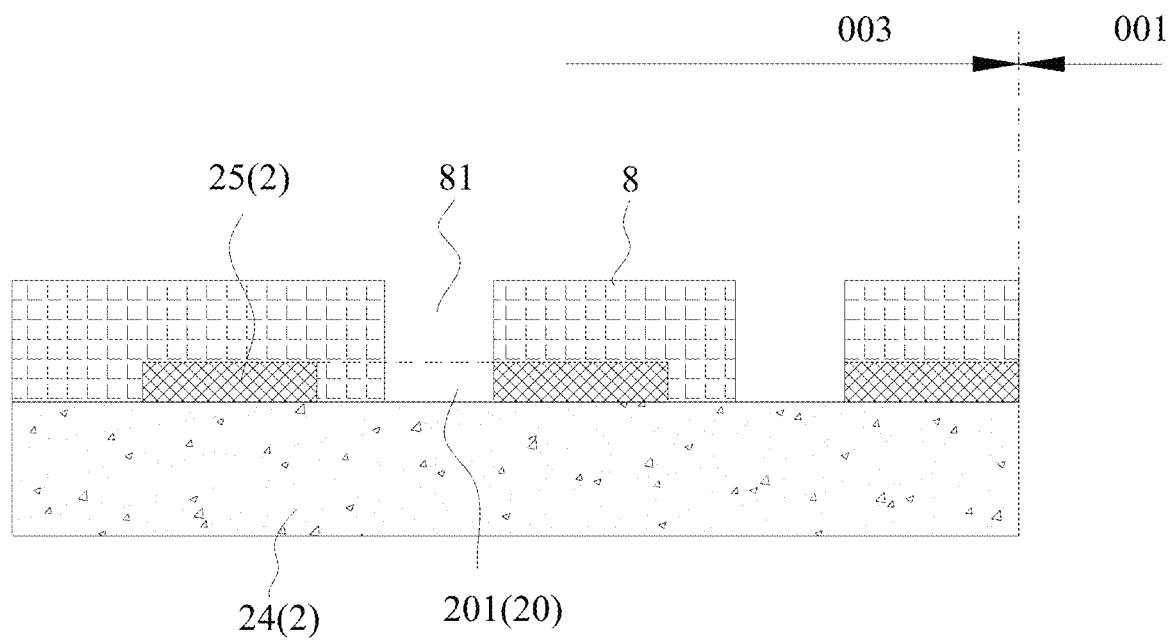
FIG. 11 is a partial structural diagram of step S1240 in an embodiment of the manufacturing method of the present disclosure.

As shown in FIG. 11, after the photoresist layer 8 is exposed and developed, a part of the photoresist layer 8 is removed, to form a removal area 81. The removal area 81 is an annular groove surrounding outside the opening 001 and exposing the second planarization layer 24. An orthographic projection of the removal area 81 on the second planarization layer 24 is located in the first slot body 201, a side wall of the removal area 81 close to the opening 001 is aligned with the second side wall 2012 of the first slot body 201 in the direction perpendicular to the substrate 1 (i.e., the orthographic projections of both on the second planarization layer 24 are overlapped), and there is a certain distance between a side wall of the removal area 81 distal to the opening 001 and the first side wall 2011 of the first slot body 201, so that the first side wall 2011 is covered by the photoresist layer 8.

In step S1250: the second planarization layer in the removal area is applied with a dry etching process, to obtain the second slot body, wherein the second slot body includes the third side wall and the fourth side wall opposite to each other, the orthographic projection of the first side wall on the substrate is located outside the orthographic projection of the second slot body on the substrate, and the orthographic projection of the second side wall on the substrate is located between the orthographic projections of the third side wall and the fourth side wall on the substrate.

Figure 12:
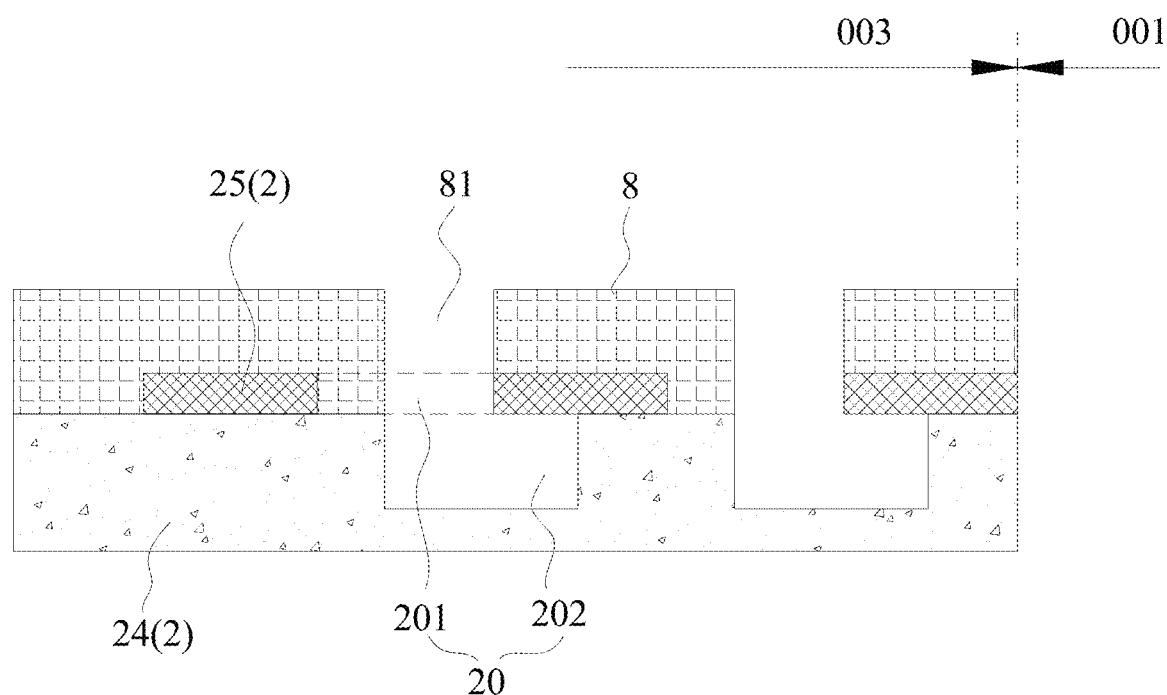
FIG. 12 is a partial structural diagram of step S1250 in an embodiment of the manufacturing method of the present disclosure.

As shown in FIG. 12, the third side wall 2021 of the second slot body 202 is exposed by the first slot body 201, while the fourth side wall 2022 is not exposed by the first slot body 201. The second slot body 202 and the first slot body 201 are intercommunicated in the direction perpendicular to the substrate 1, to form the isolation slot 20. The detailed structure of the isolation slot 20 can be referred to the embodiment of the display panel, which will not be described in detail here.

Oxygen may be used to dry etch the second planarization layer 24 exposed in the removal area 81. If the photoresist layer 8 and the second planarization layer 24 adopt the same material, dry etching has no selective ratio to both. In order to avoid that a thickness of the photoresist layer 8 is too thin to protect the separation layer 25 and the second planarization layer 24, the thickness of the etching photoresist layer 8 may be 2.5 μm-3.5 μm. For example, the thickness may be 3.0 μm.

In step S1260: the photoresist layer is removed.

As shown in FIG. 13, the photoresist layer 8 may be removed by ashing or other processes, to expose the separation layer 25 and the second planarization layer 24. Here, processes of removing the photoresist layer 8 are not specially limited.

It should be noted that the above FIGS. 7 to 12 only schematically show the formation process of the isolation slot 20, so some structures are omitted or simplified. Meanwhile, although the respective steps of the manufacturing method in the present disclosure are described in a specific order in the accompanying drawings, this does not require or imply that these steps must be performed in the specific order, or that all the steps shown must be performed in order to realize the desired results. Additionally or alternatively, some steps may be omitted, a plurality of steps may be combined into one step for execution, and/or one step may be decomposed into a plurality of steps for execution, etc.

The specific details and beneficial effects of the display panel in the manufacturing method of the present disclosure can be referred to the above embodiment of the display panel, which will not be described in detail here.

Figure 14:
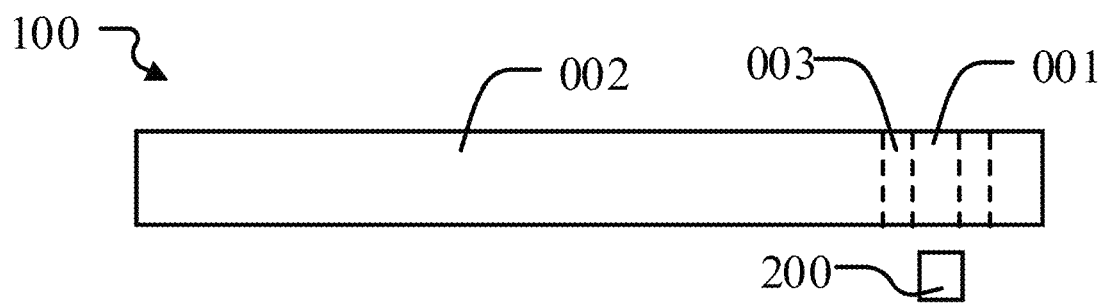
FIG. 14 is a schematic diagram of an embodiment of a display device of the present disclosure.

The embodiment of the present disclosure further provides a display device, as shown in FIG. 14, the display device may include a display panel 100 and a camera device 200.

The display panel 100 may be a display panel of any of the above embodiments, and its structure may be referred to the embodiment of the display panel above, which will not be described in detail here.

The camera device 200 is arranged on a side of the substrate 1 distal to the driving layer 2, an orthographic projection of the camera device 200 on the driving layer 2 at least partially overlaps the opening 001, and the camera device 200 is used to capture images through the opening 001. The camera device 200 may include a lens, a photoelectric sensor, etc. Here, the specific structure of the camera device 200 is not specially limited, as long as it may take an image.

The display device of the present disclosure may be an electronic device with display and shooting functions such as a mobile phone, a tablet computer, a TV, etc., which will not be listed one by one here.

After considering the description and practicing the invention disclosed herein, those skilled in the art will easily think of other embodiments of the present disclosure. The present application aims to cover any modification, use or adaptive change of the present disclosure, which follows the general principles of the present disclosure and includes common general knowledge or frequently used technical means in the technical field not disclosed in the present disclosure. The description and embodiments are only considered exemplary, and the true scope and spirit of the present disclosure are indicated by the appended claims.

What is claimed is:

1. A display panel, comprises:
    a substrate;
    a driving layer arranged on a side of the substrate, and having an opening, a pixel area outside the opening, and a transition area between the opening and the pixel area;
    an isolation slot provided on a surface of the driving layer distal to the substrate, wherein the isolation slot is located in the transition area and at least partially surrounds the opening, and the isolation slot comprises a first slot body and a second slot body sequentially intercommunicated towards the substrate, wherein the second slot body comprises a third side wall and a fourth side wall opposite to each other, the third side wall has a farthest distance from a center of the opening, and the fourth side wall has a closest distance from the center of the opening, and wherein an orthographic projection of the fourth side wall of the second slot body on the substrate is outside an orthographic projection of the first slot body on the substrate, and an orthographic projection of the third side wall of the second slot body on the substrate is between orthographic projections of two side walls of the first slot body; and
    a light-emitting device layer arranged on the surface of the driving layer distal to the substrate, and comprising a light-emitting functional layer extending to the transition area, wherein the light-emitting functional layer is disconnected in the second slot body.

2. The display panel according to claim 1, wherein the driving layer comprises:
    a pixel circuit layer, arranged on a side of the substrate;
    a first planarization layer, covering the pixel circuit layer;
    a conductive layer, arranged on a surface of the first planarization layer distal to the substrate;
    a second planarization layer, covering the conductive layer and the first planarization layer, wherein the second slot body is arranged in the second planarization layer; and
    a separation layer, arranged on a surface of the second planarization layer distal to the substrate, and located in the transition area, wherein material of the separation layer is different from that of the second planarization layer, and the first slot body is arranged in the separation layer.

3. The display panel according to claim 1, wherein the first slot body comprises a first side wall and a second side wall opposite to each other, the first side wall has a farthest distance from the center of the opening, the second side wall has a closest distance from the center of the opening, the first side wall is located on a side of the third side wall distal to the fourth side wall, and the second side wall is located between the third side wall and the fourth side wall.

4. The display panel according to claim 3, wherein a spacing between the first side wall and the third side wall is 0.5 μm to 1 μm.

5. The display panel according to claim 1, wherein the display panel further comprises:
   a first barrier dam, arranged in the transition area, and surrounding the opening, wherein the first barrier dam protrudes from the surface of the driving layer distal to the substrate, and the light-emitting functional layer covers the first barrier dam; and
   a packaging layer, covering the light-emitting device layer and the first barrier dam, wherein the packaging layer comprises an organic layer, and the organic layer is restricted on a side of the first barrier dam distal to the opening by the first barrier dam.

6. The display panel according to claim 5, wherein the light-emitting device layer further comprises:
   a first electrode layer, arranged on the surface of the driving layer distal to the substrate, and located in the pixel area, wherein the light-emitting functional layer is arranged on a surface of the first electrode layer distal to the substrate; and
   a second electrode layer, covering the light-emitting function layer, and at least partially located in the pixel area, wherein the packaging layer further comprises:
   a first inorganic layer, covering the light-emitting device layer, the first barrier dam, and the isolation slot, wherein the organic layer is arranged on a surface of the first inorganic layer distal to the substrate; and
   a second inorganic layer, covering the organic layer and the first inorganic layer.

7. The display panel according to claim 5, wherein the display panel further comprises:
   a second barrier dam, arranged in the transition area, and located on a side of the first barrier dam close to the opening,
   wherein a surface of the second barrier dam distal to the substrate is located on a side of a surface of the first barrier dam distal to the substrate, and the light-emitting functional layer covers the second barrier dam.

8. The display panel according to claim 7, wherein a number of the isolation slot is multiple, and the first barrier dam and the second barrier dam are located between two adjacent said isolation slots.

9. The display panel according to claim 2, wherein the material of the separation layer is inorganic material, and the material of the second planarization layer an organic material.

10. The display panel according to claim 1, wherein the orthographic projection of the first slot body on the substrate and an orthographic projection of the second slot body on the substrate intersect, and an area of a region of the intersecting is less than an area of the orthographic projection of the first slot body on the substrate.

11. The display panel according to claim 1, wherein a center of the orthographic projection of the first slot body on the substrate and a center of an orthographic projection of the second slot body on the substrate do not overlap.

12. The display panel according to claim 2, wherein an overlapping area of orthographic projections of the separation layer and the second planarization layer on the substrate is less than an area of the orthographic projection of the second planarization layer on the substrate.

13. The display panel according to claim 3, wherein a depth of the first slot body is less than a depth of the second slot body.

14. The display panel according to claim 1, wherein the driving layer comprises a plurality of film layers stacked in a direction distal to the substrate, the plurality of film layers comprise at least two adjacent film layers of different materials, and the first slot body and the second slot body are respectively located in the two adjacent film layers of different materials.

15. A method of manufacturing a display panel, comprising:
   providing the display panel according to claim 1;
   forming a driving layer on a side of a substrate, wherein the driving layer has an opening, a pixel area outside the opening, and a transition area between the opening and the pixel area; and,
   forming an isolation slot on a surface of the driving layer distal to the substrate, wherein the isolation slot is located in the transition area and at least partially surrounds the opening, and the isolation slot comprises a first slot body and a second slot body sequentially intercommunicated towards the substrate, wherein the second slot body comprises a third side wall and a fourth side wall opposite to each other, the third side wall has a farthest distance from a center of the opening, and the fourth side wall has a closest distance from the center of the opening, and wherein an orthographic projection of fourth side wall of the second slot body on the substrate is outside an orthographic projection of the first slot body on the substrate, and an orthographic projection of the third side wall of the second slot body on the substrate is between orthographic projections of two side walls of the first slot body.

16. The method of manufacturing a display panel according to claim 15, wherein the driving layer comprises:
   a pixel circuit layer, arranged on a side of the substrate;
   a first planarization layer, covering the pixel circuit layer;
   a conductive layer, arranged on a surface of the first planarization layer distal to the substrate; and
   a second planarization layer, covering the conductive layer and the first planarization layer,
   wherein forming the isolation slot on the surface of the driving layer distal to the substrate comprises:
   forming a separation material layer on a surface of the second planarization layer distal to the substrate, wherein material of the separation material layer is different from that of the second planarization layer;
   applying a photo-etching process on the separation material layer, to obtain a separation layer, wherein the separation layer is located in the transition area, the separation layer has a first slot body exposing the second planarization layer, the first slot body comprises a first side wall and a second side wall opposite to each other, the first side wall has a farthest distance from the center of the opening, and the second side wall has a closest distance from the center of the opening;
   forming a photoresist layer covering the separation layer and filling the first slot body;
   exposing and developing the photoresist layer, to form a removal area in the transition area surrounding the opening, wherein removal area exposes the second planarization layer, an orthographic projection of the removal area on the second planarization layer is located in the first slot body, a side wall of the removal area distal to the opening is located on a side of the first side wall close to the opening, and a side wall of the removal area close to the opening overlaps the orthographic projection of the second side wall on the second planarization layer;

etching the second planarization layer in the removal area by a dry etching process, to obtain the second slot body, an orthographic projection of the first side wall on the substrate is located outside an orthographic projection of the second slot body on the substrate, and the orthographic projection of the second side wall on the substrate is located between orthographic projections of the third side wall and the fourth side wall on the substrate; and removing the photoresist layer.

17. The method of manufacturing a display panel according to claim 16, wherein a thickness of the photoresist layer is 3.0 μm.

18. The method of manufacturing a display panel according to claim 16, wherein the material of the separation layer is inorganic material, and the material of the second planarization layer is organic material.

19. A display device, comprising:
the display panel according to claim 1; and
a camera device arranged on a side of the substrate distal to the driving layer, wherein an orthographic projection of the camera device on the driving layer at least partially overlaps the opening, and the camera device is configured to capture images through the opening.

20. The display device according to claim 19, wherein the driving layer comprises:
a pixel circuit layer arranged on a side of the substrate;
a first planarization layer covering the pixel circuit layer;
a conductive layer arranged on a surface of the first planarization layer distal to the substrate;
a second planarization layer covering the conductive layer and the first planarization layer, wherein the second slot body is arranged in the second planarization layer; and
a separation layer arranged on a surface of the second planarization layer distal to the substrate, and located in the transition area, wherein material of the separation layer is different from that of the second planarization layer, and the first slot body is arranged in the separation layer.

* * * * *